United States Patent [19]
Wu

[11] Patent Number: 5,131,456
[45] Date of Patent: Jul. 21, 1992

[54] BIMETALLIC INSERT FIN FOR HIGH CONDUCTION COOLING STRUCTURE

[75] Inventor: Fwu-Huei Wu, Poughkeepsie, N.Y.

[73] Assignee: IBM Corporation, Armonk, N.Y.

[21] Appl. No.: 724,139

[22] Filed: Jul. 1, 1991

[51] Int. Cl.⁵ .................. F28F 27/00; F28F 13/00
[52] U.S. Cl. ............................ 165/32; 165/80.4; 165/96; 165/80.3; 361/385; 361/384; 357/82
[58] Field of Search ............. 165/80.4, 32, 96 HV, 165/80.3; 361/385, 384; 357/82

[56] References Cited

U.S. PATENT DOCUMENTS

| | | | |
|---|---|---|---|
| 2,782,782 | 2/1957 | Taylor | 165/32 |
| 2,902,266 | 9/1959 | Isham | 165/96 |
| 2,949,283 | 8/1960 | Smith | 165/32 |
| 3,225,820 | 12/1965 | Riordan | 165/32 |
| 3,438,430 | 4/1969 | Kestemont | 165/32 |
| 3,489,203 | 1/1970 | Fischell | 165/32 |
| 3,823,772 | 7/1974 | Lavering et al. | |
| 4,254,431 | 3/1981 | Babuka et al. | |
| 4,263,965 | 4/1981 | Mansuria et al. | |
| 4,381,032 | 4/1983 | Cutchaw | |
| 4,483,389 | 11/1984 | Balderes et al. | |
| 4,535,841 | 8/1985 | Kok | |
| 4,685,211 | 8/1987 | Hagihara et al. | |
| 4,709,754 | 12/1987 | Chu et al. | |
| 4,765,400 | 8/1988 | Chu et al. | |
| 4,770,242 | 9/1988 | Daikoku et al. | |
| 4,800,956 | 1/1989 | Hamburgen | |

FOREIGN PATENT DOCUMENTS

| | | | |
|---|---|---|---|
| 0030593 | 3/1981 | Japan | 165/32 |
| 0080913 | 5/1982 | Japan | 165/32 |
| 0092247 | 6/1983 | Japan | 165/32 |
| 0155893 | 8/1985 | Japan | 165/32 |
| 0518614 | 7/1976 | U.S.S.R. | 165/32 |

OTHER PUBLICATIONS

R. C. Chu & R. E. Simms "A Bimetallic Retention Device" IBM Technical Disclosure Bulletin vol.20, No. 2, Jul. 1977 p. 675.

*Primary Examiner*—John K. Ford
*Attorney, Agent, or Firm*—Whitham & Marhoefer

[57] ABSTRACT

A high conduction cooling structure useful for dissipating heat from integrated circuit devices includes a cooling base (10), a bulk heat transfer element (18), adjacent spaced apart cooling fins (14 and 16), and a bimetallic strip (22). The cooling base (10) is positioned in heat transfer relationship with an integrated circuit device and as it increases in temperature, the bimetallic strip (22) flexes outwardly and contacts the cooling fins (14 and 16). The contact created with the cooling fins (14 and 16) allows for more efficient transfer of thermal energy.

14 Claims, 2 Drawing Sheets

BIMETALLIC INSERT FIN FOR HIGH CONDUCTION COOLING STRUCTURE

BACKGROUND OF THE INVENTION

1. Field of the Invention

The present invention generally relates to high conduction cooling (HCC) structures used for dissipating heat produced by integrated circuits or the like and, more particularly, to HCC structures of the interdigitated cooling fin variety.

2. Description of the Prior Art

Large-sized computer systems typically include many closely spaced integrated circuit devices which can be packaged separately or together. Collectively, these integrated circuit devices produce a large amount of heat which, if not dissipated properly, will adversely impact on the performance of the computer system. The problem of proper heat dissipation from closely packed integrated circuit devices is well known. For example, U.S. Pat. No. 4,263,965 to Mansuria et al., U.S. Pat. No. 4,381,032 to Cutchaw, U.S. Pat. No. 4,483,389 to Balderes et al., U.S. Pat. No. 4,535,841 to Kok, U.S. Pat. No. 4,685,211 to Hagihara et al., and U.S. Pat. No. 4,765,400 each show different arrangements for dissipating heat from closely spaced integrated circuit devices and each arrangement includes a separate cooling base element for contacting each of the integrated circuit devices and a bulk heat transfer element positioned in heat transfer relationship with all of the cooling base elements. Heat is transferred from the integrated circuit device to the cooling base element and then to the bulk heat transfer element. From the bulk heat transfer element, heat is either dissipated to the air or is carried away by a refrigerant fluid which contacts the bulk heat transfer element.

Recently, interdigitated cooling fin designs have been used in the large-sized computer environment for dissipating heat from closely packed integrated circuit devices. For example, U.S. Pat. No. 4,770,242 and U.S. Pat. No. 4,800,956 each show heat dissipation arrangements for integrated circuits comprised of cooling bases with upwardly projecting cooling fins which interact with the downwardly projecting cooling fins of a bulk heat transfer element. The cooling fins on each element are arranged as spaced parallel rows and resemble a comb in cross-section. The cooling base and bulk heat transfer element are put together such that the parallel rows of cooling fins on the cooling base are interdigitated with the parallel rows of cooling fins on the bulk heat transfer element. The cooling fins significantly increase the surface area which can be used for heat transfer. One problem with the interdigitated cooling fin design is that the heat transfer elements must be machined to fairly exacting tolerances in order to fit together properly; hence, the cost of production is higher. Another problem with the interdigitated design relates to the efficiency of heat transfer between the cooling base which contacts the integrated circuit device and the bulk heat transfer element. Heat transfer between thermally conductive elements is more efficient when the elements touch one another as compared to when they are separated by a space. However, in most prior art interdigitated HCC structures, the machining process used to produce the cooling fins results in a small gap being created between the cooling base and the bulk heat transfer element which reduces the efficiency of heat transfer between the cooling base and the bulk heat transfer element.

SUMMARY OF THE INVENTION

It is therefore an object of the present invention to provide an improved thermal heat dissipation arrangement useful for integrated circuit device applications.

It is another object of the present invention to utilize a bimetallic element as a thermal conductor in an HCC structure.

According to the invention, an HCC structure includes a cooling base and a bulk heat transfer element where either the cooling base or the bulk heat transfer element includes an integral comb-like arrangement of cooling fins. The remaining element (cooling base or bulk heat transfer element) includes a plurality of bimetallic members affixed in slots in the element where the bimetallic members are interdigitally positioned with respect to the cooling fins. Heat is transferred between the cooling base and the bulk heat transfer element in the same manner as with other interdigitated HCC designs; however, as the bimetallic elements increase in temperature, they flex outwardly (due to the differences in the thermal expansion coefficients) and contact the adjacent cooling fins. The direct contact with the cooling fins allows for more efficient heat transfer between the cooling base and the bulk heat transfer element. Preferably, the bimetallic members are U-shaped such that they may contact both adjacent cooling fins upon heat up to have enhanced heat transfer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
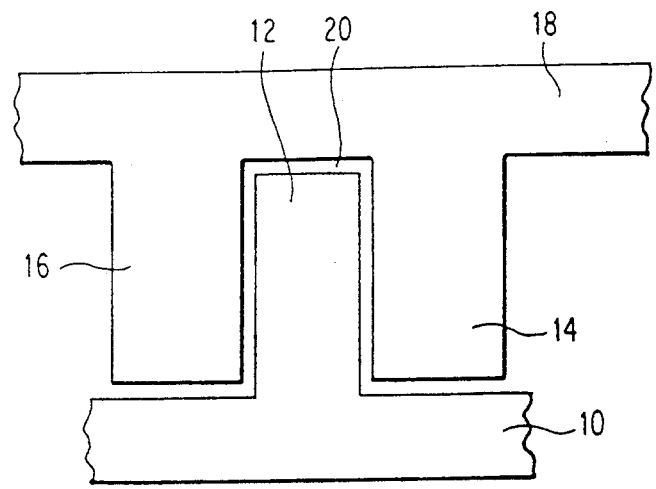
FIG. 1 is a cross-sectional side view of a portion of a prior art HCC structure with one upwardly projecting cooling fin of a cooling base positioned between two downwardly projecting cooling fins of a bulk heat transfer element.

Referring now to the drawings, and more particularly to FIG. 1, there is shown a cooling base 10 having an upwardly projecting cooling fin 12 which is positioned between the downwardly projecting cooling fins 14 and 16 of a bulk heat transfer element 18. The HCC structure shown in FIG. 1 is representative of the prior art in interdigitated HCC structures. In most HCC structures, the cooling base 10 contacts the top side of an integrated circuit device (not shown) and the bulk heat transfer element 18 is arranged to transfer heat to a cooling fluid. In interdigitated HCC structures, the cooling base 10 often has a plurality of upwardly projecting cooling fins 12 that are interdigitated with the downwardly projecting cooling fins 14 and 16. In addition, the bulk heat transfer element 18 is typically much larger that the cooling base 10 and typically has a plurality of cooling bases 10 positioned in like heat transfer relationship. The bulk heat transfer element 18 is typically made of aluminum and is sometimes called a "hat" structure. The cooling base 10 is typically made of copper and is often called an "insert" structure. Copper transfers heat much more efficiently than does aluminum, but is heavier and more expensive than aluminum.

One problem with the prior art HCC structure shown in FIG. 1 is the machining tolerances are such that to get the upwardly projecting cooling fin 12 to fit between the downwardly projecting cooling fins 14 and 16, a gap 20 is almost always created between the cooling fins 12, 14, and 16. The gap 20 inherently breaks down the efficiency of heat transfer from the cooling base 10 to the bulk heat transfer element 18. Ideal heat transfer would occur when the cooling fins 12, 14, and 16 are in contact with one another. This invention specifically addresses the problem of providing an HCC structure where heat is more efficiently transferred between the cooling base 10 and bulk heat transfer element 18.

Figure 2:
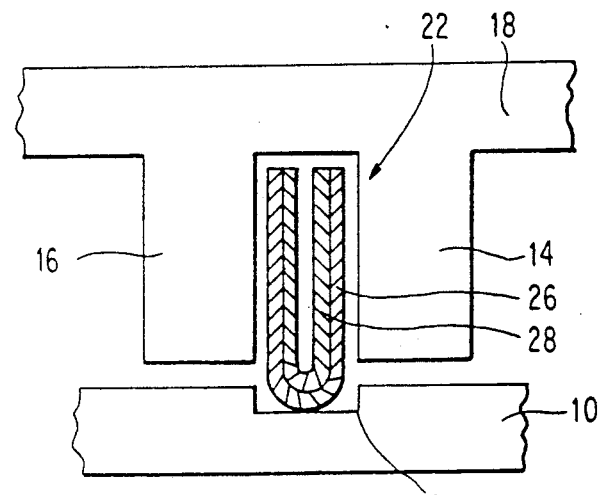
FIG. 2 is a cross-sectional side view of a portion of an arrangement for the inventive HCC structure with a U-shaped bimetallic member positioned on the cooling base between the two downwardly projecting cooling fins of the bulk heat transfer element.
Figure 3:
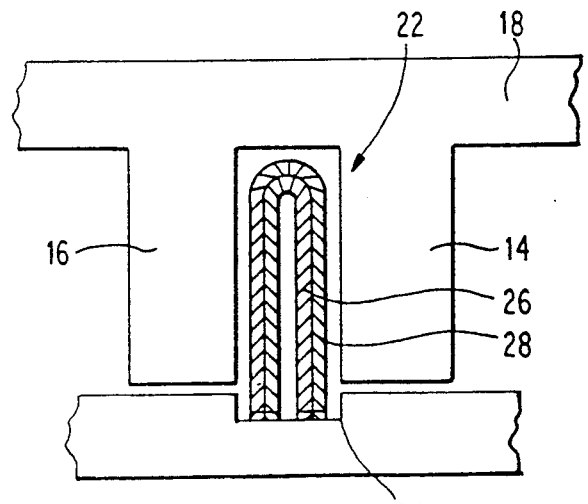
FIG. 3 is a cross-sectional side view of a portion of an alternative arrangement for the inventive HCC structure with an inverted U-shaped bimetallic member positioned on the cooling base between the two downwardly projecting cooling fins of the bulk heat transfer element.

FIGS. 2 and 3 show alternative configurations of an HCC cooling structure where a bulk heat transfer element 18 has downwardly projecting cooling fins 14 and 16 which is the same as in the prior art. However, the cooling base 10 includes a U-shaped bimetallic member 22 projecting upward between the fins 14 and 16 from a slotted region 24. The U-shaped bimetallic member 22 is preferably made of a two sided strip where one side 26 is a material having a low coefficient of thermal expansion such as copper and the other side 28 is a material having a high coefficient of thermal expansion such as aluminum (copper has a thermal coefficient of expansion of approximately $9.8*10^{-6}/°F$. and aluminum has a thermal coefficient of expansion of approximately $13*10^{-6}/°F$.) Because of the differences in the thermal coefficients of expansion, the U-shaped bimetallic member 22 flexes outwardly as it increases in temperature to contact the cooling fins 14 and 16 and thereby provide better transfer of thermal energy to the bulk heat transfer element 18.

In use, for example, the integrated circuit will heat up during processing operations. The heat will be transferred to the cooling base 10 which contacts the integrated circuit. The heat from the cooling base 10 will then be transferred to the U-shaped bimetallic member 22 and to portions of the downwardly projecting cooling fins 14 and 16. Preferably, the U-shaped bimetallic member 22 is secured to the cooling base by positioning it within slot 24 and through the use of solder, rivets, brazing or the like. As the bimetallic member 22 heats up, it spreads outwardly and contacts the sidewalls of the cooling fins 14 and 16. The contact with the side walls allows for heat to be efficiently conducted to the bulk heat transfer element 18 (the "hat"). Hence, an important advantage of the present invention is providing a means for making contact between the bulk heat transfer element 18 and the cooling base 10 in an interdigitated HCC structure.

Figure 4:
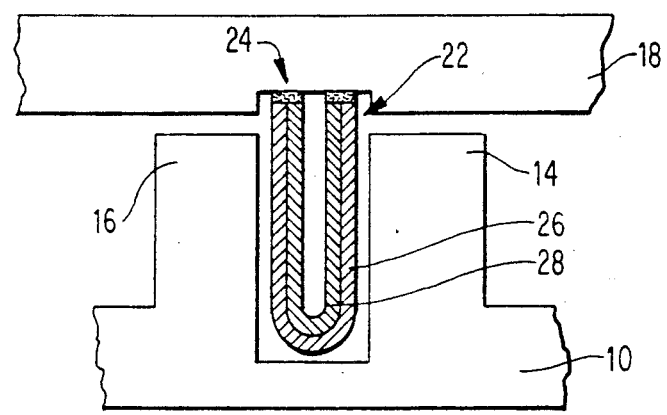
FIG. 4 is a cross-sectional side view of a portion of an arrangement for the inventive HCC structure with the U-shaped bimetallic member positioned on the bulk heat transfer element between two upwardly projecting cooling fins of the cooling base.
Figure 5:
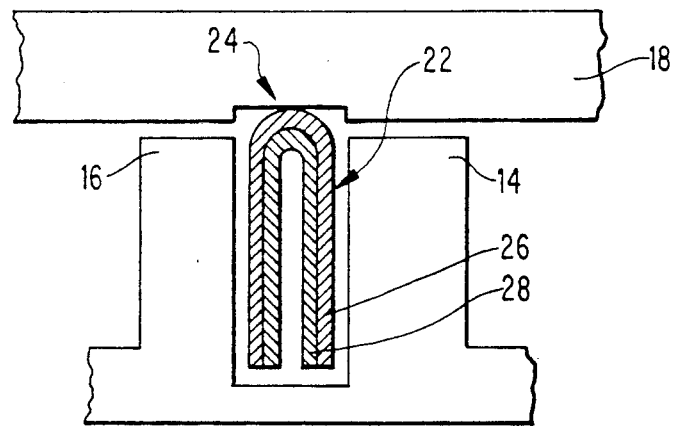
FIG. 5 is a cross-sectional side view of a portion of an arrangement for the inventive HCC structure with the inverted U-shaped bimetallic member positioned on the bulk heat transfer element between two upwardly projecting cooling fins of the cooling base.

It should be understood that the reverse configuration of FIGS. 2 and 3 could be used, where the U-shaped bimetallic element 22 could be positioned on the bulk heat transfer element 18 between upwardly projecting cooling fins 12 in the cooling base 10. These arrangements are shown in FIGS. 4 and 5. In addition, the shape of the bimetallic strip 22 and the thicknesses of materials 26 and 28 as well as the choice of materials 26 and 28 could be varied so as to control the temperature at which the bimetallic strip 22 makes contact between the cooling base 10 and bulk heat transfer element 18. In some cooling applications, delaying the time and temperature of contact between a cooling base 10 and a bulk heat transfer element 18 could be desired. One advantage of the U-shape and inverted U-shape of the bimetallic strip 22 shown in FIGS. 2 and 3, respectively, is that contact will be made with two adjacent cooling fins of the opposing element. A straight bimetallic strip 22 could be used in the inventive HCC structure; however, only one cooling fin on the opposing element (cooling base or bulk heat transfer element) would be contacted upon an increase in temperature.

While the invention has been described in terms of its preferred embodiment where a U-shaped bimetallic element connected to the cooling base is used to provide a contacting bridge between the cooling base and bulk heat transfer element cooling fins when the cooling base increases in temperature due to the thermal load from an integrated circuit structure, those skilled in the art will recognize that the invention can be practiced with considerable variation within the spirit and scope of the appended claims.

Having thus described my invention, what I claim as new and desire to secure by Letters Patent is as follows:

1. An apparatus for cooling electronic devices, comprising:

a cooling base having a first side which can be positioned in a heat transfer relationship with an electronic device and a second side;

a bulk heat transfer element having a first side which can be positioned to transfer heat to air or a refrigerant and a second side, said second side of said bulk heat transfer element facing said second side of said cooling base;

a set of cooling fins projecting from said second side of said bulk heat transfer element towards said second side of said cooling base, said set of cooling fins including at least a pair of adjacent, spaced apart fins; and a bimetallic member positioned on said cooling base and projecting towards said second side of said bulk heat transfer element, said bimetallic member being positioned between said pair of adjacent spaced apart fins, said bimetallic member contacting said pair of adjacent, spaced apart fins upon an increase in temperature.

2. An apparatus as recited in claim 1 wherein said bimetallic member includes a copper material on a first surface and an aluminum material on a second surface.

3. An apparatus as recited in claim 1 wherein said bimetallic member is formed in a U-shape, where the base of the U is adjacent to said cooling base.

4. An apparatus as recited in claim 1 wherein said bimetallic member is formed in a U-shape, where the open end of the U is adjacent to said cooling base.

5. An apparatus as recited in claim 1 wherein said bimetallic member is connected to said cooling base by solder.

6. An apparatus as recited in claim 1 wherein said cooling base includes a slot created in said second side for accommodating said bimetallic member.

7. An apparatus as recited in claim 1 wherein said set of cooling fins are integrally formed with said bulk heat transfer element.

8. An apparatus for cooling electronic devices, comprising:
- a cooling base having a first side which can be positioned in a heat transfer relationship with an electronic device and a second side;
- a bulk heat transfer element having a first side which can be positioned to transfer heat to air or a refrigerant and a second side, said second side of said bulk heat transfer element facing said second side of said cooling base;
- a set of cooling fins projecting from said second side of said cooling base towards said second side of said bulk heat transfer element, said jet of cooling fins including at least a pair of adjacent, spaced apart fins; and
- a bimetallic member positioned on said bulk heat transfer element and projecting towards said second side of said cooling base, said bimetallic member being positioned between said pair of adjacent spaced apart fins, said bimetallic member contacting said pair of adjacent, spaced apart fins upon an increase in temperature.

9. An apparatus recited in claim 8 wherein said bimetallic member includes a copper material on a first surface and an aluminum material on a second surface.

10. An apparatus as recited in claim 8 wherein said bimetallic member is formed in a U-shape, where the open end of the U is adjacent to said bulk heat transfer element.

11. An apparatus as recited in claim 8 wherein said bimetallic member is formed in a U-shape, where the base of the U is adjacent to said bulk heat transfer element.

12. An apparatus as recited in claim 8 wherein said bimetallic member is connected to said bulk heat transfer element by solder.

13. An apparatus as recited in claim 8 wherein said bulk heat transfer element includes a slot created in said second side for accommodating said bimetallic member.

14. An apparatus as recited in claim 8 wherein said set of cooling fins are integrally formed with said cooling base.

* * * * *